Sept. 2, 1958 P. V. HORTON 2,850,681

SUBMINIATURE STRUCTURE FOR ELECTRICAL APPARATUS

Filed Sept. 28, 1955 2 Sheets-Sheet 1

INVENTOR
PAUL V. HORTON
BY Alvin J. Riddles
AGENT

Sept. 2, 1958 P. V. HORTON 2,850,681

SUBMINIATURE STRUCTURE FOR ELECTRICAL APPARATUS

Filed Sept. 28, 1955 2 Sheets-Sheet 2

INVENTOR
PAUL V. HORTON

BY Alvin J. Riddles

AGENT

United States Patent Office 2,850,681

Patented Sept. 2, 1958

2,850,681

SUBMINIATURE STRUCTURE FOR ELECTRICAL APPARATUS

Paul V. Horton, Poughkeepsie, N. Y., assignor to International Business Machines Corporation, New York, N. Y., a corporation of New York Application September 28, 1955, Serial No. 537,181

8 Claims. (Cl. 317—101)

This invention relates to a structure for the mounting of electronic components in a very small volume and particularly to a structure for the compact mounting of subminiature electronic components employing printed circuit fabrication and assembly techniques.

In the development and utilization of electronic equipment the physical size of the piece of equipment becomes of greater importance as the degree of complexity and the number of components in the equipment increase. Not only is the use of the particular piece of equipment sometimes limited by excessive size but also the distance between sections of a piece of equipment often imposes electrical disadvantages due to cable length, etc., that seriously limit the functions the device can perform. Much development time and effort is spent in reducing the size of electronic equipment so that a greater variety of useful functions may be performed with devices occupying a smaller volume of space.

In reducing the size of a piece of electronic equipment three major problems must be overcome. These are: providing an adequate method of heat dissipation; providing ready access to the components; and minimizing hand labor operations which increase cost. The structure of this invention that has been found best to overcome these problems uses mounting wafers for the electronic components, the size of which is very near that of the component. These wafers are attached by connecting tabs to a laminar structure having printed wiring on individual laminations, and connecting pins attached to the outermost lamination serve to connect and to support the assembly as a pluggable unit.

Accordingly, the primary object of this invention is to provide a subminiature structure for mounting electronic components with a high density of components in a given volume.

Another object of this invention is to provide a subminiature structure which supports electronic components and is adaptable to printed circuit techniques.

Still another object of this invention is to provide a detachable electronic circuit mounting occupying a relatively small volume and having a rigid mechanical structure.

A related object of this invention is to provide an electronic component mounting that is adaptable to machine fabrication methods.

Other objects of the invention will be pointed out in the following description and claims and illustrated in the accompanying drawings, which disclose, by way of example, the principle of the invention and the best mode, which has been contemplated, of applying that principle.

The subminiature electronic component structure of this invention is made up of two types of elements, these are component mounting wafers and printed wiring bearing laminations. The component mounting wafers are provided in several types, each type being constructed to meet the needs of the particular component it is to support. The laminations provide printed wiring which serves to connect the components into a circuit, support the component mounting wafers and provide a base to which external circuit connecting terminals may be attached.

The individual components used to make up the electronic circuitry that can be assembled in this structure include a resistor, a capacitor, an inductance, a crystal diode and a transistor. In the construction of a piece of electronic equipment it is frequently desirable to have the circuitry organized so that component circuits for example triggers, amplifiers etc. are removable for servicing as a unit at a place remote from the piece of electronic equipment itself. When this is desirable, the components are usually permanently connected in the component circuit which is made detachable as a unit. For this purpose component mounting wafers are provided that have the components permanently attached. Similarly, it may also be desirable to have a certain component detachable, due for example to marginal performance. Hence, mounting wafers are provided in several types adapted to the component they are to support and to the circuitry organization of the particular machine in which this subminiature structure is to be used. These individual component mounting wafer types will be described in detail in connection with the particular component they are designed to support.

*Resistor component*

Figure 1:
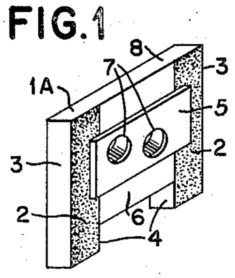
Figure 1 is a view of a resistor component adapted for use in the subminiature assembly of this invention.

A resistor component is made by applying a resistive area to a component mounting wafer surface by printed circuit techniques. A resistor component is shown in Figure 1 wherein a component mounting wafer 1A, made of any suitable insulating material such as phenolic, is provided with electrodes 2 extending along its edges 3 and over mounting and connecting tabs 4. The electrodes 2 may be applied to the mounting wafer 1A by any printed circuit fabrication technique, metal spraying and photo etching being examples of such techniques. A resistive coating 5 is deposited on the surface 6 of component mounting wafer 1A and makes connection with the electrodes 2. The coating 5 may consist of a material applied by the silk screen process or by some other method of printed circuit fabrication, or it may be an adhesive tape resistor.

The fabricated resistor is corrected to a precise value by punching holes 7 through the resistive coating 5 and the mounting wafer 1A. An alternative method of value correction would be to abrade the resistive material 5 to reduce thickness or to abrade the combination of resistive material 5 and the mounting wafer 1A along edge 8 until a sufficient reduction in resistive area takes place to establish the desired value.

*Capacitor component*

Figure 2:
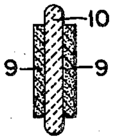
Figure 2 is a cross sectional view of a capacitor.
Figure 3:
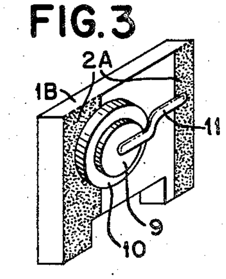
Figure 3 shows one method of mounting the capacitor of Figure 2 on a supporting wafer.

The capacitor component is mounted on a capacitor mounting wafer similar to that of the resistor mounting. The capacitor may be formed in one manner by applying a silver paint to opposite sides of a dielectric spacer which for example may be a ceramic disc. The formed capacitor may then be attached to a mounting wafer for assembly as a component. Referring now to Figure 2 there is shown a cross section of a capacitor wherein electrodes 9 are applied to both sides of a dielectric spacer 10. The manner of application of the electrodes 9 and the materials used therefor may be varied over a wide range. The structure primarily contemplated is made by using printed circuit fabrication techniques adaptable for automatic machine fabrication methods. Some examples of such construction involve the firing of silver on a ceramic, the spraying of metal on a dielectric, or the photo etching of electrodes on a dielectric. The capacitor may be attached, after forming, to a component mounting wafer as shown in Figure 3. In this structure, the component mounting wafer 1B, made of any suitable non-conducting material such as phenolic, has electrodes 2A applied on one surface so as to make connection with the electrodes of the capacitor. One of the electrodes 9 of the capacitor is attached by soldering to one terminal 2A on the mounting wafer 1B, and, a conducting tab 11 is soldered to the other electrode 9 and to the other terminal 2A of the mounting wafer. Precision in capacitor components is attained by control of both the material and thickness of the dielectric 10 and by control of the area of electrode 9 in fabrication before mounting on the component mounting wafer 1B.

Figure 4:
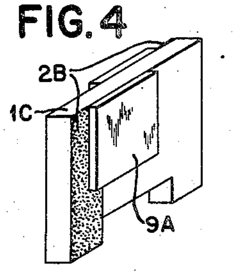
Figure 4 shows another form of capacitor structure employing a mounting wafer.

A second type of capacitor component may be made by applying the capacitor electrodes to the component wafer itself. This type of construction may be seen in Figure 4 wherein the capacitor component using the mounting wafer as the dielectric is shown. Terminals 2B are applied to opposite faces of the component mounting wafer 1C, and the capacitor electrodes 9A are applied to opposite faces of the mounting wafer, one electrode 9A connecting one terminal 2B on one face and the other connecting electrode 2B on the opposite face. This results in a capacitor structure wherein the component mounting wafer 1C serves as the dielectric. Precision capacitor value may be obtained by removing, through abrading or other means, from the upper end of the assembly, a portion of appropriate size to establish the desired value. The dielectric material used for the mounting wafer in this instance should be selected having a dielectric constant so as to produce a capacitor in the range desired. In both types of construction of the capacitor mounting it will be noted that each step of the manufacturing procedure is readily adaptable to automatic machine fabrication methods.

*Crystal diode component*

Figure 5:
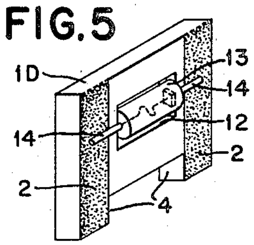
Figure 5 shows a crystal diode mounted on a supporting wafer.

The mounting of a crystal diode is accomplished by providing a mounting wafer on which the crystal diode is fixed or is pluggably mounted. A fixed mounting for a crystal diode is shown in Figure 5 wherein a mounting wafer 1D of suitable insulating material, such as phenolic, is provided with an aperture 12 to accommodate a diode 13. Terminals 2 are applied to the edges of the wafer 1D by printed circuit methods, and leads 14 of the diode 13 are connected to the terminals 2 by soldering or similar means. The mounting wafer 1D with the diode 13 attached is connected in a circuit by tabs 4; as will be described later.

Figure 6:
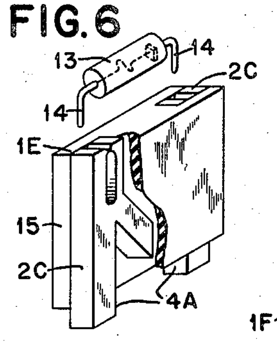
Figure 6 shows a method of pluggably mounting a crystal diode on a supporting wafer.

A mounting wafer for pluggably supporting a crystal diode is shown in Figure 6 wherein a mounting wafer 1E is made up of a block 15 of insulating material, such as phenolic, and has terminals 2C embedded therein at its opposite edges. The terminals are made of a resilient conducting material such as brass and are provided with pin engaging slots adapted to receive the leads 14 of the diode 13. The lower ends of the terminals 2C extend below the block 15 so as to provide tab portions 4A for making connections to a circuit.

*Transistor component*

Figure 7:
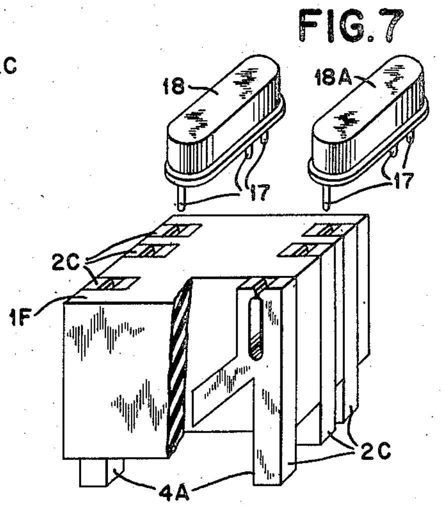
Figure 7 shows a pluggable transistor mounting.
Figure 8:
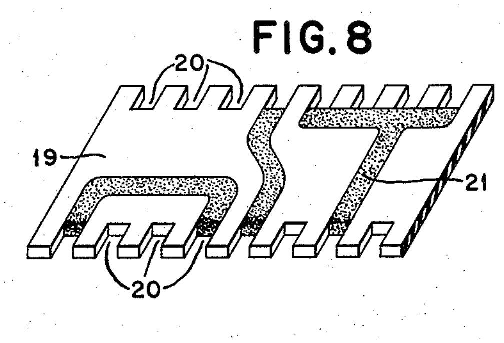
Figure 8 is a view of a circuit bearing base lamination.
Figure 9:
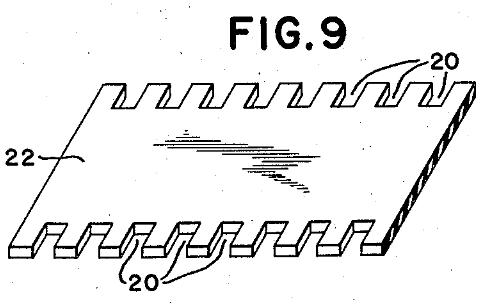
Figure 9 is a view of an insulating base lamination.
Figure 10:
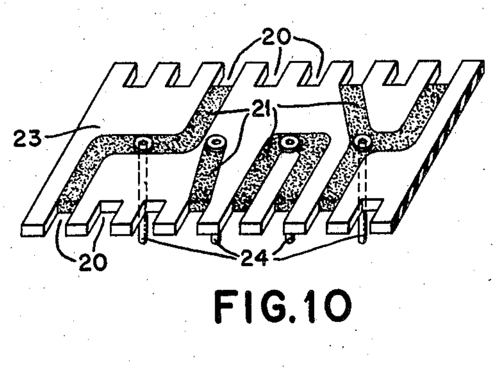
Figure 10 is a view of a circuit bearing base lamination with connecting pins.

The mounting of a transistor may be accomplished by providing a mounting wafer 1F is shown in Figure 7. In this case, the wafer is made of insulating material in block form as in Figure 6, but the block is sufficiently large to carry three terminals 2C along one side for receiving the terminals 17 of a transistor 18. If desired, three terminals 2C may be provided at the opposite side of the wafer for receiving terminals 17 of a second transistor 18A. The terminals 2C for each transistor are arranged along one side of the block so that the tabs 4A may be received within notches along the sides of lamination plates as shown in Figures 8, 9 and 10. This makes it possible to use uniformly notched lamination plates for all components, and to arrange the components in any order desired on the plates.

*Inductance component*

An inductance coil may be mounted in a small pluggable unit, not shown, and inserted into terminals 2C of a wafer like that shown in Figure 6. If more than two terminals are provided on the inductance unit, a wafer similar to that of Figure 7 may be used for mounting the unit. It is only necessary that the terminals 2C of the wafer be properly spaced to receive the terminals of the unit and to fit into notches of laminations to be described. It should be noted that transistor and inductor components may be permanently attached to a mounting support such as described above by fastening them to the block and soldering the leads to the terminals 2C.

*Circuit bearing laminations*

The circuit components when mounted on the supporting wafers are connected into the wiring of a piece of electronic equipment in which they are to be used through the use of a base which is made up of circuit bearing laminations. The circuit bearing laminations are equipped with notches to engage the connecting tabs on the component mounting wafers, and the outermost lamination is equipped with pins which support the assembly as a pluggable unit and provide external circuit connections.

Referring now to Figure 8 there is shown one circuit bearing base lamination 19 made of a suitable insulating material such as phenolic and having notches 20 along the edges to receive the connecting tabs on the various component mounting wafers. Printed wiring patterns 21 are provided on both sides of the lamination 19 between the notches 20 to make such connections as may be necessary to connect the components on the mounting wafers to form the desired circuit. The lamination 19 may be formed by any established fabrication operation such as by stamping. The printed wiring 21 may be applied by any printed circuit technique such as by photo-etching or metal spraying, and connections between patterns on opposite sides of the lamination may be made either at the notches or by providing such connections in the form of eyelets or plated holes through the lamination from one pattern to another.

Figures 11, 12:
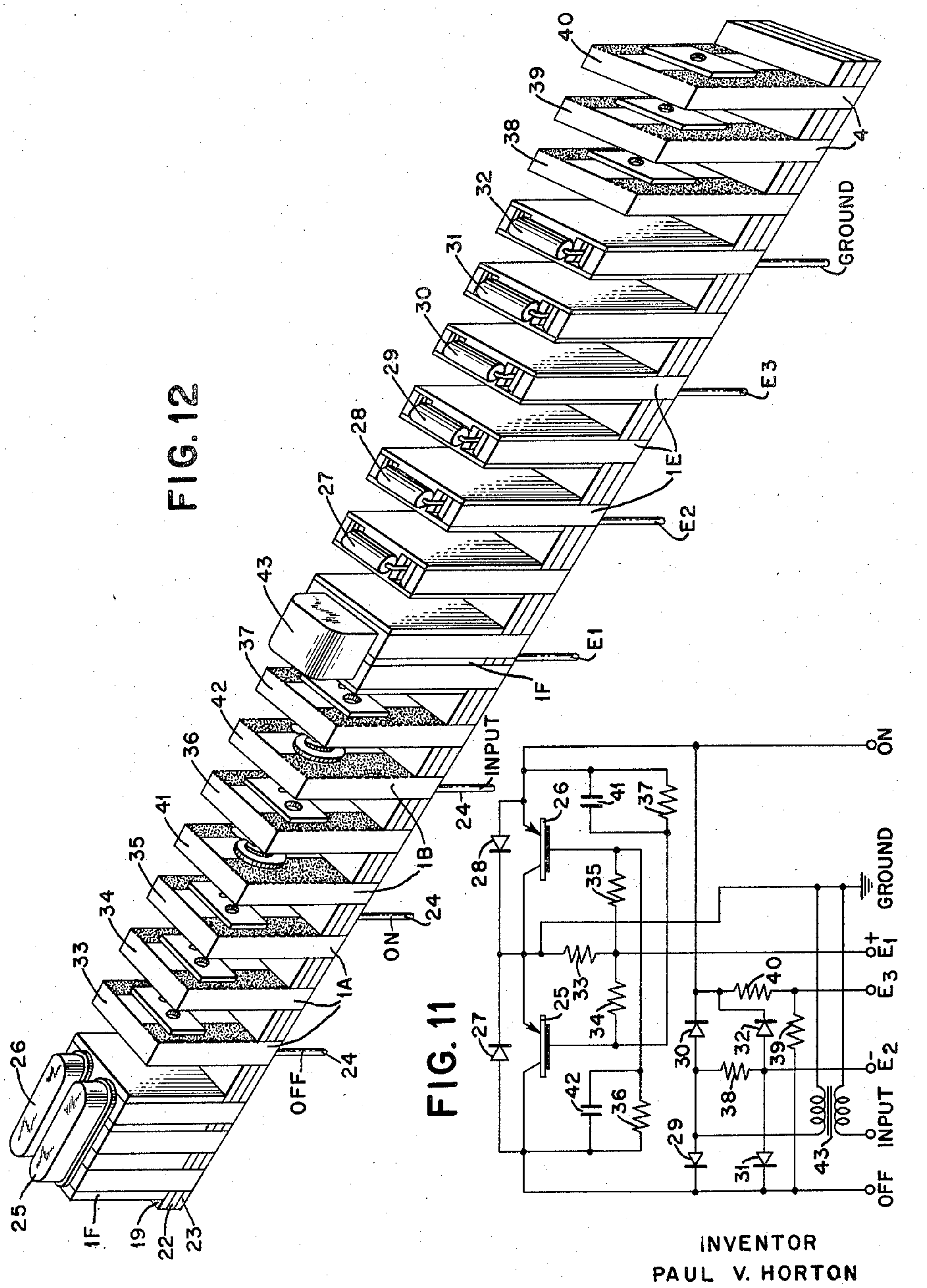
Figure 11 is a wiring diagram of a binary connected two transistor trigger.
Figure 12 is a view of the trigger of Figure 11 assembled in the structure of this invention.

Several of these laminations may be stacked together, as shown in Figure 12, to provide sufficient printed wiring to complete a desired circuit. To prevent printed wiring patterns on adjacent laminations from making contact with each other at points where connections are not desirable, a laminar insulating member 22 (Figure 9) is provided with notches 20 to coincide with the other pieces when sandwiched in a laminar structure. It should be noted that it would also be possible to coat the circuit bearing laminations with an insulating coating which would perform the function of this lamination.

External connections to the wiring of the particular piece of electronic equipment in which this assembly is to be used are made through pins attached to the lower lamination 23 of the laminated base structure. A lamination of this type is shown in Figure 10 wherein pins 24 are attached to the lamination 23 by riveting or similar means and make connection with printed conductors 21.

The final assembly of the laminations and the component mounting wafers is completely interconnected by a single dip soldering operation in which all connecting tabs on the component mounting wafers are connected in the notches in the laminations with all points of the printed wiring appearing at the notches in the base laminations. The completed assembly may be potted, if desired, in wax or any suitable potting resin.

To fully appreciate the degree of subminiaturization that can be achieved with the technique of this invention, a binary connected two transistor trigger circuit is shown as an example of a typical electronic component circuit that can be assembled in this structure. In Figure 11 is shown a wiring diagram of a transformer input, two transistor binary connected trigger. The circuit contains two transistors 25 and 26, six crystal diodes 27, 28, 29, 30, 31 and 32, eight resistors 33, 34, 35, 36, 37, 38, 39 and 40, two capacitors 41 and 42, one transformer component 43 and seven external connection terminals labeled Off, On, Input, $E_1$, $E_2$, $E_3$ and Ground respectively. These components may be assembled in the subminiature structure as shown in Figure 12 wherein the reference numbers of the components are the same as those in the wiring diagram of Figure 11. In Figure 12 each component is shown assembled with a compatible mounting wafer. The interconnecting wiring is printed on both sides of the base laminations 19 and 23 and connects the components through the tabs 4 in notches 20. The external circuit connections are made through pins 24 fixed to lamination 23. The circuit of this example can be made into a completed assembly approximately ½ inch high, ⅝ inch wide and 2 inches long. The transistor components 25 and 26 and the transformer component 43 extend above the others by the dimensions of the commercially available components which is generally on the order of ⅜ inch. The length of the pins 24 is determined by the type of socket structure, not shown, adapted to receive them, but these are generally about ½ inch long. These dimensions are included merely to aid in comprehending the degree of subminiaturization that can be achieved and should not be construed as limitations since wide variations in size are possible within the spirit of the invention. All sizes shown in the figures of the drawing have been relative and some exaggeration has been used in the interest of clarity.

While there have been shown and described and pointed out the fundamental novel features of the invention as applied to some preferred embodiments it will be understood that various omissions and substitutions and changes in the form and details of the device illustrated and in its operation may be made by those skilled in the art without departing from the spirit of the invention. It is the intention therefore to be limited only as to the scope of the following claims.

What is claimed is:

1. An assembly for supporting electric components in a circuit comprising, in combination, a plurality of wafers made of a rigid insulating material, each of said wafers having tab portions extending from opposite extremes of one of its faces, conductors fixed to each of said wafers and extending to the tab portions thereon, means for connecting the terminals of one electrical component to the conductors on each of said wafers, a flat base member comprising a plurality of laminations insulated from each other each lamination being made of an insulating material and having notches along opposite edges for receiving said tab portions on said wafers, conductors extending over each lamination of said base member between said notches so as to connect said components in a desired circuit, means for connecting said conductors on said tab portions to said conductors on said base member, and terminals rigidly fixed to an external lamination of said base member and connected to the conductors thereon.

2. The assembly of claim 1 in which said conductors on said base laminations and said conductive means on said wafers is printed wiring.

3. In a subminiature electronic circuit structure, a plurality of component mounting supports each of said supports being provided with at least one surface on which one electronic component is mounted, a plurality of connecting portions along opposite edges extending beyond a third edge of said component mounting support and electrical connecting means connecting each of said connecting portions with said mounted electronic component, a base support made up of a plurality of insulated laminations each lamination of said support being provided with a plurality of notches along opposite edges to engage said connecting portions of said component mounting supports a plurality of electrically conductive support terminals insulated from each other and rigidly attached to an external one of said laminations, connecting means providing connections from said notches to said support terminals.

4. In a subminiature electronic circuit mounting structure as in claim 3 wherein said connecting means is applied to said component mounting supports and to the laminations of said base support in the form of printed circuit conductors.

5. In a pluggable subminiature electronic component, a base support including a plurality of superimposed laminations of insulating material each lamination having a plurality of apertures along opposite edges, certain of said apertures having conductive walls, a plurality of supporting and external circuit connecting terminals rigidly attached to an external one of said laminations, electrical connecting means on said laminations connecting said terminals and said walls of said certain apertures, a plurality of component mounting supports each including at least one surface on which an electronic component may be mounted, said component mounting supports being provided with protruding portions along parallel edges thereof engaging said apertures in said base lamination and provided with electrical connecting means adapted to connect an electronic component mounted thereon with said protruding portion.

6. In a pluggable subminiature electronic component as in claim 5 said electrical connecting means applied to said base laminations and to said component mounting support being in the form of printed circuit conductors.

7. A chassis structure for a multi-component subminiature circuit array comprising in combination a pluraity of component mounting supports each having at least one electronic component attached thereto, each of said mounting supports being provided with a plurality of protruding portions along parallel faces thereof and connecting means so arranged to connect each of said protruding portions with a terminal of said electronic component, a first base lamination having notches along two opposite edges so constructed to accommodate said protruding portions of said mounting supports and printed wiring on at least one face thereof intersecting at least one of said notches, a second base lamination having said notches and printed wiring and connecting pins rigidly attached to said lamination extending at right angles to one surface thereof and intersecting said printed wiring, a third base lamination of insulating material having said notches and positioned between said first and said second base laminations, and connecting means making electrical connection between said printed wiring and said protruding portions of said supports.

8. A subminiature electronic chassis structure comprising in combination a plurality of component mounting supports, said supports having at least one electronic component attached thereto said supports being provided with a plurality of spaced protruding portions extending beyond one edge thereof said protruding portions being connected to the terminals of said electronic components by conducting materials applied to said supports, a laminated base structure provided with notches along two parallel edges adapted to receive said protruding portions of said mounting supports and to rigidly retain said supports in an upright position with respect to said base, said base including a plurality of circuit bearing laminations separated from each other by insulating laminations and the outermost circuit bearing lamination being provided with a plurality of external connecting and supporting pins rigidly attached intersecting the circuitry on said outermost lamination and extending at right angles to the surfaces of said lamination and electrical connecting means connecting circuitry on said circuit bearing laminations with said protruding portions.

References Cited in the file of this patent

UNITED STATES PATENTS

| | | |
|---|---|---|
| 2,019,625 | O'Brien | Nov. 5, 1935 |
| 2,547,022 | Leno | Apr. 3, 1951 |
| 2,707,272 | Blitz | Apr. 26, 1955 |
| 2,754,454 | McNutt | July 10, 1956 |